(12) United States Patent
Miller

(10) Patent No.: US 9,208,267 B2
(45) Date of Patent: Dec. 8, 2015

(54) CLOUD BASED SIMULATION AND ANALYSIS FOR CONTROL APPLIANCES

(71) Applicant: GE Intelligent Platforms, Inc., Charlottesville, VA (US)

(72) Inventor: Daniel Halvard Miller, Charlottesville, VA (US)

(73) Assignee: GE INTELLIGENT PLATFORMS, INC, Charlottesville, VA (US)

(*) Notice: Subject to any disclaimer, the term of this patent is extended or adjusted under 35 U.S.C. 154(b) by 381 days.

(21) Appl. No.: 13/751,444

(22) Filed: Jan. 28, 2013

(65) Prior Publication Data

US 2014/0214392 A1 Jul. 31, 2014

(51) Int. Cl.
*G06F 17/50* (2006.01)

(52) U.S. Cl.
CPC .................................. *G06F 17/5009* (2013.01)

(58) Field of Classification Search
USPC ................. 703/2, 22; 709/217, 223; 705/348; 718/1
See application file for complete search history.

(56) References Cited

U.S. PATENT DOCUMENTS

| | | | |
|---|---|---|---|
| 7,885,793 B2* | 2/2011 | Padmanabhan | 703/2 |
| 8,417,938 B1* | 4/2013 | Considine et al. | 713/151 |
| 8,514,868 B2* | 8/2013 | Hill | 370/401 |
| 2005/0235282 A1 | 10/2005 | Anderson | |
| 2008/0162262 A1 | 7/2008 | Perkins | |
| 2010/0131624 A1 | 5/2010 | Ferris | |
| 2011/0055034 A1 | 3/2011 | Ferris et al. | |
| 2011/0138050 A1 | 6/2011 | Dawson et al. | |
| 2011/0184575 A1 | 7/2011 | Kawamoto et al. | |
| 2012/0209947 A1* | 8/2012 | Glaser et al. | 709/217 |
| 2013/0268643 A1* | 10/2013 | Chang et al. | 709/223 |
| 2013/0326516 A1* | 12/2013 | Hill | 718/1 |

(Continued)

FOREIGN PATENT DOCUMENTS

| | | |
|---|---|---|
| EP | 1659468 A2 | 5/2006 |
| EP | 2383956 A2 | 11/2011 |

(Continued)

OTHER PUBLICATIONS

Search Report and Written Opinion from PCT/US2014/010636 dated May 6, 2014.

(Continued)

*Primary Examiner* — Thai Phan
(74) *Attorney, Agent, or Firm* — GE Global Patent Operation; Catherine J. Toppin

(57) ABSTRACT

A cloud computing system according to various embodiments can include a computing cloud comprising at least one processing unit and at least one database and a plurality of users in communication with the computing cloud. The computing cloud is configured to receive a request to select a product and define a model of an infrastructure system associated with the selected product. The computing cloud generates a first model of the infrastructure system including a first control system, and generates a second model of the infrastructure system including a second control system. The cloud computing simulates a first control operations of the first model of the infrastructure system in operation with the first control system and simulates a second control operations of the second model of the infrastructure system in operation with the second control system. The cloud computing compares results of the first and second control operations.

20 Claims, 4 Drawing Sheets

(56) References Cited

U.S. PATENT DOCUMENTS

2013/0346493 A1* 12/2013 Martin .................... 709/204
2014/0156557 A1* 6/2014 Zeng et al. .................. 705/348

FOREIGN PATENT DOCUMENTS

WO   2008090216      7/2008
WO   2008090216 A1   7/2008

OTHER PUBLICATIONS

Gabriele D'Angelo: "Parallel and distributed simulation from many cores to the public cloud", High Performance Computing and Simulation (HPCS), 2011 International Conference On, IEEE, Jul. 4, 2011, pp. 14-23, XP031962305.

Chandar et al. "Connect Cloud and On-Premise Applications Using IBM WebSphere Cast Iron Integration", IBM Redbooks (Jun. 13, 2011).

* cited by examiner

CLOUD BASED SIMULATION AND ANALYSIS FOR CONTROL APPLIANCES

I. FIELD OF THE INVENTION

The present invention relates generally to the use of cloud computing for control systems. More particularly, the present invention relates to a system and method for using cloud computing to simulate operation of a device, process or system managed or regulated by a control system.

II. BACKGROUND OF THE INVENTION

As many consumers seek to replace their older, existing control system operated equipment, the selection of the new replacement equipment is a critical decision that will significantly affect the entire system in which the new equipment will operate. The replacement equipment will affect the current and future ability of the system to achieve true process optimization. Therefore, the consumer must use due diligence to carefully select the replacement equipment.

However, if the consumer wishes to analyze a new product and its operating data to aid in the selection process before purchase and installation, this information typically is provided to the consumer in the form of technical sheets. Consumers have to compare the operational data of the new product outlined on the technical sheet to their current systems and industry related data without the aid of a visual simulation. Normally, the consumers do not understand the complex, technical operating parameters on the technical sheet data and how they compare to the their current system. To avoid this tedious task, some consumers may want to use conventional simulation software to create a visual simulation model of the new product and its operation.

However, one of the problems with conventional simulation systems is that the most accurate simulation models are too expensive to be deployed on local systems. In addition, the most accurate simulation models have storage requirements that exceed the available storage of the local data storage. Furthermore, when any changes are made to the current system, the simulation models become obsolete.

Rather than using the resources of the local systems, a growing trend is that users are employing cloud computing to generate simulation models, which is the use of computing resources, hardware and software, that are delivered as a service over a network. Typically, cloud computing services in the public cloud are hosted on the Internet, managed and maintained by third-party providers. Users access cloud computing using networked user devices, such as desktop computers, laptops, tablets and smartphones. Since the users do not own the infrastructure and are merely accessing or renting, they can avoid the initial capital expenditure and instead consume computing resources as a service.

With cloud computing, instead of installing and maintaining applications on every user device in order to interact with the data that may be spread across one or more devices, data is encapsulated in applications that are hosted as services on servers and delivered from those servers to the devices as clients.

There is a need for a system that provides a visually appealing, interactive and informative mechanism for a consumer to learn about a system before purchasing it. There is a need for a system that enables a user to easily generate a simulation model of the user's existing equipment operating in the user's current system and a simulation model of the new product operating in the user's current system.

There is a need for the system to provide a comparison of the relative benefits of the operation of the two simulated models. There also remains a need to optimize the operation of the user's system by generating enhanced simulation models that are forward-looking and take into account, for example, external market conditions and environmental regulations, to maximize the current and future profitability of the user's system.

III. SUMMARY OF THE EMBODIMENTS

In at least one aspect, the present disclosure provides a method for using cloud computing to simulate operations of a control system. The method comprises the steps of receiving at a cloud computing system a request to select a product; defining a model of an infrastructure system associated with the selected product; generating a first model of the infrastructure system including a first control system; generating a second model of the infrastructure system including a second control system; simulating a first control operations of the first model of the infrastructure system in operation with the first control system; simulating a second control operations of the second model of the infrastructure system in operation with the second control system; and comparing results of the first control operations with results of the second control operations.

In at least another aspect, the present disclosure provides a cloud computing system including a computing cloud comprising at least one processing unit and at least one database and a plurality of users in communication with the computing cloud. The computing cloud is configured to receive a request to select a product and define a model of an infrastructure system associated with the selected product. The computing cloud generates a first model of the infrastructure system including a first control system, and generates a second model of the infrastructure system including a second control system. The cloud computing simulates a first control operations of the first model of the infrastructure system in operation with the first control system and simulates a second control operations of the second model of the infrastructure system in operation with the second control system. The cloud computing compares results of the first and second control operations.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

IV. BRIEF DESCRIPTION OF THE DRAWINGS

The present invention may take form in various components and arrangements of components, and in various process operations and arrangements of process operations. The present invention is illustrated in the accompanying drawings, throughout which, like reference numerals may indicate corresponding or similar parts in the various figures. The drawings are only for purposes of illustrating preferred embodiments and are not to be construed as limiting the disclosure. Given the following enabling description of the drawings, the novel aspects of the present disclosure should become evident to a person of ordinary skill in the art.

V. DETAILED DESCRIPTION OF EMBODIMENTS OF THE INVENTION

While the present invention is described herein with illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

In at least one embodiment, the system and method enables users to use cloud based software to compare their current control systems with control system for sale in a control appliance marketplace. The cloud based system simulates both versions of the software of the current control system and the new current control system and displays an analysis of the differences between the two systems. The analysis may include specific comparisons that are relevant to a selected industry, as well as cost and performance data.

The comparison of the control systems can be achieved initially by either prompting the user to answer specific engineering questions or selecting a pre-configured solution that closely resembles the current set up of the user's system. The system enables the user to control and alter the different simulations and view an analysis between the two control systems. Data can be gathered from the Internet and compiled with the simulations in order to show the relevant comparisons between the two systems. The comparisons can be defined to a specific industry and purpose of the appliance.

For example, the comparison may include factors such as changes in input and output values, efficiency, performance and run-time of the appliance. Additionally, the system enables the user to use the simulation software to test new product improvements that are available for purchase.

Figure 1:
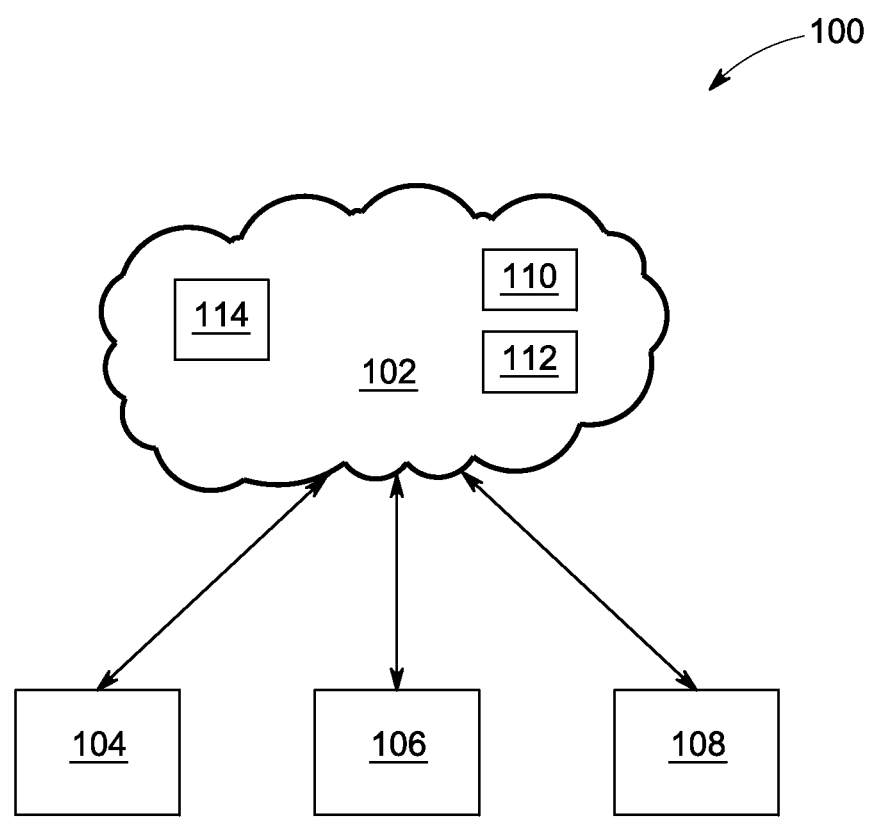
FIG. 1 illustrates an exemplary embodiment of a cloud computing system in accordance with the present disclosure.

FIG. 1 illustrates an exemplary system 100 for using cloud computing 102 to simulate operation of a control system. Cloud computing 102 is connected to a plurality of clients 104, 106, and 108. Cloud computing 102 includes processing unit 110, data storage unit 112, and simulation model 114. Cloud computing 102 is a computing cloud that is capable of storing information and performing data functions on information. A computing cloud comprises at least one computer that is accessible from a remote location. The computing cloud 102 may comprise a plurality of storage devices and a plurality of processing units.

Examples of clients 104, 106, and 108 can include individual computers, such as a laptop, palmtop, or tablet, a personal digital assistant, a network access device, or other similar device, a residential location, a business locations, plant sites, or operational locations, or a combination thereof, in communication with the computing cloud 102. While three clients are illustrated in connection with cloud computing 102, this is merely exemplary, and a substantially greater number of clients can be connected with the cloud computing 102.

Clients 104, 106, and 108 are capable of accessing the processing unit 110 and the storage unit 112 that are located in the computing cloud 102. Clients 104, 106, and 108 are configured to access local computing devices and processes and information from the computing cloud 102. Clients 104, 106, and 108 may also include a plurality of gauges and sensors installed to monitor the control systems in an operational environment.

The sensor may detect any operational condition of one or more control systems, such as temperature, pressure, airflow, vibration or other measurable operating parameters. Clients 104, 106, and 108 can communicate with the computing cloud 102 through any secured or unsecured methods, including Hypertext Transfer Protocol Secure (HTTPS), secure telnet or file transfer protocol secure (FTPS).

Figure 2:
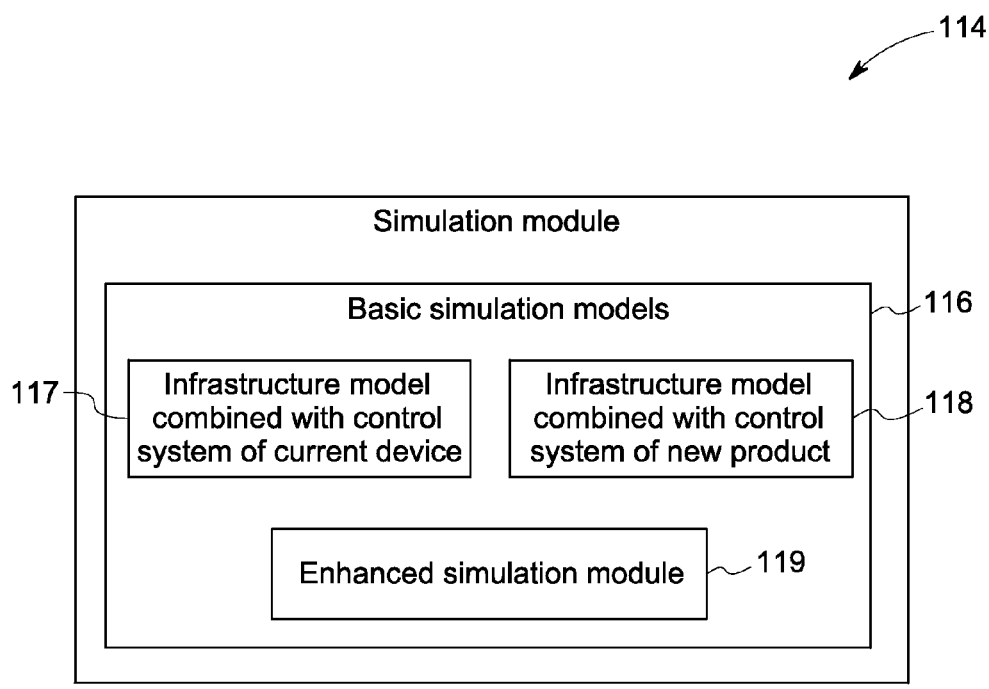
FIG. 2 illustrates an exemplary embodiment of a simulation module in accordance with the present disclosure.

FIG. 2 illustrates the simulation module 114, which utilizes a technique to generate simulations that can be utilized to test, prove, or validate a device, a system, a process or solution prior to installation, implementation or construction of, for example, a device, a building, a facility, a system, a process, a machine, or a plant.

Through the use of visual representations depicted as simulations, the system 100 is configured to rapidly deploy new products, services or features to a plurality of clients 104, 106, and 108 without the need to make changes to the clients themselves. As a new product becomes available, this new product may be offered to a client to improve, for example, a manufacturing process at a given site and tested in a simulation implemented on computing cloud 102 without the need for physically installing and testing the new product at the site.

For example, utilizing the simulation module 114, system 100 can enable end users, such as companies, to create simulations of entire plants operating with a new product or service installed therein before the new product or service is actually purchased and physically installed within the plant. When a company has it manufacturing process fully simulated, it becomes easier to analyze a product design and observe how well it performs in a manufacturing setting.

There is an opportunity to perform test, gather performance data, analyze the benefits, and make changes before the new product or service is too cost prohibitive to modify or remove after installation.

Thus, products can be initially selected so they perform well in the manufacturing simulation which should mitigate problems in actual production thus mitigating overall system operating costs. According to the exemplary embodiment disclosed herein, simulation of the plant's entire operations can also be implemented, thus demonstrating the interrelation of how every process in a plant performs.

A user of the system 100 can access the cloud computing 102 over a network such as the Internet and select a new product or services being offered by a manufacturer or service provider. To ensure the accuracy of the selection, the user can invoke the simulation module 114 to generate both a basic simulation model 116 and an enhanced simulated model 119.

A basic simulation model 116 includes a simulation of the user's current infrastructure (building, plant, and network) which supports the operation of the user's current device. For example, a home owner accesses the system 100 and enters a selection to replace a heat pump operating within the home. The home owner's infrastructure is the house and the components relevant to sensing, monitoring and controlling the operation of the heat pump. If the structure of the house includes energy efficient windows, the system includes the parameters of the energy efficient windows the simulation model of the infrastructure. Thus, the system 100 generates a model of the user's house including the relevant components.

Another example is that of a business owner of a steam plant accessing the system and entering a selection for a new boiler to replace the current boiler. In this example, the infrastructure of the steam plant includes the control systems and software required to operate, manage and monitor the system as well as the buildings that are part of the system.

It is noted that as used according to the present disclosure, the term "infrastructure" means a set of interconnected structural elements that provide a framework needed for supporting the operation of an entire structure or system. Namely, an infrastructure includes the physical components of interrelated systems. Infrastructure systems include both the fixed assets, and the control systems and software required to operate, manage and monitor the system, as well as any accessory buildings, plants or forms of transportation that are an essential part of the system.

An infrastructure may include, for example, a manufacturing infrastructure, a residential infrastructure (e.g., a home), an energy infrastructure (e.g., an electrical power network, a steam or hot water production and distribution network), a transportation infrastructure (e.g., a mass transit system, an airport), a communication infrastructure (e.g., a telephone network, a telecommunication network), a social infrastructure (e.g., a health care system, an education system), and an economic infrastructure (e.g., a banking system and financial institutions).

The system 100 provides the simulation module 114 as a cloud-based application for users to begin formulating the parameters and profiles of the simulations. The simulation module 114 is located and operated in the cloud computing 102 and the user accesses the technique on the cloud computing 102 through the use of a network such as the Internet. This eliminates the need to install and run the application on the user's own computer simplifying maintenance and support and reducing operational cost.

The simulation module 114 constructs and executes simulation models of the infrastructure in accordance with initial specifications or parameters defined by data provided by the user. A user interface (not shown) is provided so the user can communicate data to the simulation module 114. The user interface can be provided to query the user on the important aspects of the user's system. Surveys can be administered asking questions about operational requirements or other performance aspects of the user's system. In some embodiments, standardized simulation of conventional infrastructures or components modeled based on industry standards can be provided for selection by the user in a drop down list. In other embodiments, industry templates may be generated to start constructing a simulated infrastructure in a given industry by suggesting various component options related to a selected device.

In some embodiments, the system 100 automatically generates the simulated infrastructure based on historical data stored in the databases or accessed through a network such as the Internet. Performance profiles associated with any device, product or service in a system can be included in the profile data. Parameters to construct the simulation models can be selected based on the component selected, operating characteristics, particular industry, performance or other desired outcome.

Once the constructs for the simulation model are defined, they are stored in the database of the data storage unit 112. System 100 allows for some or all of the data related to the infrastructure and its components of the clients 104, 106, and 108 to be stored in a central global data repository within the computing cloud 102. The data stored in this repository may include the current status of the infrastructure and its components located throughout one or more client systems. The cloud computing services are accessible anywhere in the world, using the network as a single point of access for the client.

In FIG. 2, after the simulation model of the user's infrastructure is generated, a model of the user's current device or system is generated. The system 100 then combines the simulation of the current device or system into the simulation model of the user's infrastructure to create the basic simulation model of the user's infrastructure operating with the current device 117.

Next, a basic simulation model of the user's infrastructure operating with the new device 118 is generated by combining a simulation of the selected new product into the model of the user's infrastructure. Thus, the system uses the model of the user's infrastructure in conjunction with both the simulation model of the existing device and the simulation model of the newly selected device or system, which the user has selected and is considering for purchase. When the relevant data has been identified and collected, the simulation module 114 executes a simulated operation based on the simulation models, stores and returns the result of the simulation.

The system 100 then runs the operation of the control systems of the simulation of both models to obtain operational data for both simulations. The system 100 then performs a comparison of the operational data of the control data, results and relative benefits of the two basic simulated models 117 and 118. Then, the system 100 can monetize the savings to determine if the new product is purchased and installed in the user's infrastructure how long it will take to recoup the purchase price of the new device.

Thus, the system 100 can present, for example, information regarding the results to the user including run time, change in input and output values, efficiency, cost, monetization of savings, performance and run-time of the product, and environmental factors.

The basic simulation of the infrastructure described above is not an exact model of the user's infrastructure, but rather a general visual representation. To obtain more accurate simulations and performance results, enhanced simulated models may be generated by the system 100 by collecting additional data to better define the parameters or profiles of the simulations.

The parameters or profiles can be derived from data relating to a specific industry and collected from client databases, cloud computing databases and data available on the Internet. Such collected data can include, for example, equipment settings, valve voltage and currents, range settings, and critical values learned from past simulations. The simulation models 117, 118, and 119 and collected data may be stored in database 112, which may include a history of simulations that have been previously run.

The enhancement of the basic models 117, 118 provides a forward-looking approach to optimize the efficiency of the model to increase productivity and profitability of the user's system the simulation model of the infrastructure to gain a sustainable competitive advantage, regardless of fluctuating marketplace demands and constraints.

The optimization process of the basic simulation models 117 and 118 may be programmed to consistently take into account evolving constraints that affect profitability goals, production schedules, and operational processes. Some of the enhanced features that provide the forward-looking approach may include, for example, in various embodiments, data aggregation, continuous iterative analysis, real-time control, regulatory constraints, predictive analysis, and market fluctuations. The user may select to implement one or more of the enhancement features.

An enhanced feature of the system is the ability to provide enhanced data collection and analysis. To begin the enhanced simulation and optimization process, the system 100 aggregates data to ensure the quality and comprehensiveness of the operational data collected and analyzed. System 100 has the ability to collect data from all disparate sources across their operations for a consolidated view, enabling further analysis, and to use that information to drive continuous improvements. The visibility and operational insight that comes from data aggregations supports intelligent decision making needed for process optimization.

System 100 can aggregate data regarding one or more system components, and these components can be in the same geographic area or diverse geographic areas. Cloud computing 102 may then collect, analyze, and inform based on this data. By aggregating and analyzing the data in real time, improvements may be made to the operating processes of the basic simulation models 117 and 118. Through the linking of the clients 104, 106, and 108 to the computing cloud 102, data may be uploaded to the cloud 102 by the clients 104, 106, and 108 that represents real time information related to the data processes.

This information may, in turn, be used by the computing cloud 102 for a number of functions, including monitoring the production results and identifying potential problems with equipment. For instance, the cloud computing 102 may enhance a model to identify potential equipment failure. This feature allows for proactive preventative maintenance of the equipment. For example, the system 100 may monitor an operation configured as a closed loop operating system, which runs with advanced controllers connected to all control points and gauges with high speed data storage.

The system 100 controls the operating parameters with automated advance controllers and a technique, which enable enhanced precision and better performance. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

To definitively assess operation of the simulated model, the system may collect data over shorter periods of time, and the analysis may be performed continually through the period of the run cycle.

Thus, the system 100 may provide continuous iterative analysis that takes place at different times during the process cycle as opposed to only steady-state conditions to reveal operating conditions that may otherwise go undetected— providing critical insight to balance key operating parameters over time. Readings may be taken, for example, at ten seconds, then at the next seven seconds, and then at the next five seconds. Each of the readings may be stored in the computing cloud 102 for enhanced analysis.

The iterative analysis can be performed to determine, for example, whether the operation as represented by the simulated models vary over time. If so, in what areas do the variations occur? What are the causes? This information enables the system to detect and address the reasons behind sub-optimal performance. Thus, the system 100 determines initially what data is available for analysis and then whether that data provides information required to perform the iterative analysis. If more than one component or process may be used to effectuate the enhanced modeling, the simulation module 114 may employ a logic component to determine which component or process to use.

The system 100 may also optimize the simulation models based on non-classic parameters, such as regulatory requirements and environmental regulations. The system 100 may monitor the operating parameters defined in the regulations, in additional to the operating parameters. The system 100 learns the correct regulatory setting, taking into account each variable to meet the regulatory constraints.

The system 100 evaluates the operating parameters measured and recorded regarding the regulation constraints with all data available from the user's system, and the computing cloud 102 integrates the data into actionable information. Thus, the optimization of the simulation model is continually redefined with increasing regulations and other constraints and the data collected to enhance operating performance of the user's system.

System 100 is further configured to provide predictive analysis, which is the ability to predict operational problems and alert the user, such as a plant operator, to review the data and take corrective action. The system is able to provide early and actionable insight by identify a looming problem—resulting in increased reliability of the user's system. The system 100 also provides critical alarm management to notify the users of an issue or upset event. However, too many alarms can inundate a user, such as a plant operator, and deter productivity. The risk of not addressing alarms correctly or at all can lead to unsafe conditions and operational failures.

The user needs the ability to efficiently prioritize and respond to the most critical alarms with the proper corrective action while keeping secondary alarms silenced for follow up at a later point. Thus, system 100 provides a logical hierarchy that guides the user through proper procedures—helping to take automatic action on the most pressing needs in priority order, responding with the right action every time. The system 100 can also detect multiple alarms related to the same cause.

The logic function of the system 100 is capable of performing root cause analysis and presenting the user with the source of the problem and triggering the workflow to help trouble shoot the critical alarms, enabling quick resolution—or in some cases, preventing problems before they occur. The computing cloud 102 can distribute notices and schedule the maintenance for the user's system and its components.

The system 100 is further configured to ensure flexibility and responsiveness. In some embodiments, the system 100 may have the ability to position the production provided by the user's system and represented by the simulation model to flexibly respond to current market prices. For example, when the price of a product or commodity is high, a plant owner may consider committing 80% of the capacity into the market and keeping 20% as reserve. This type of flexibility provides new options for bidding strategies to the owner, who can take advantage of financial rewards for flexible operations.

Figure 3A:
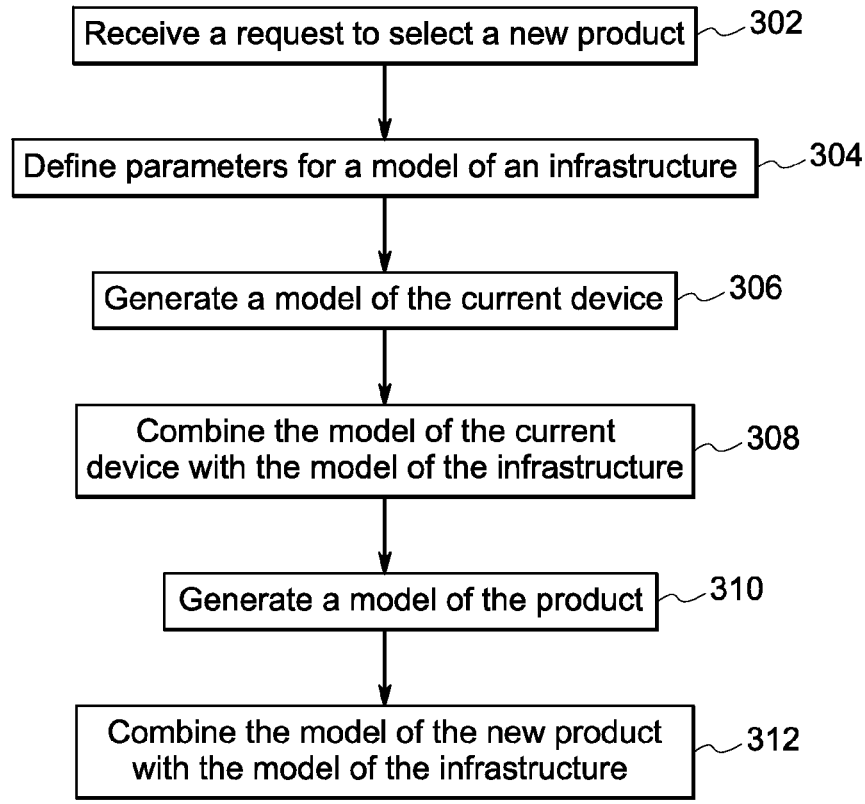
FIGS. 3A-3B illustrate a process flow diagram of a method for generating simulation models in accordance with the present disclosure.
Figure 3B:
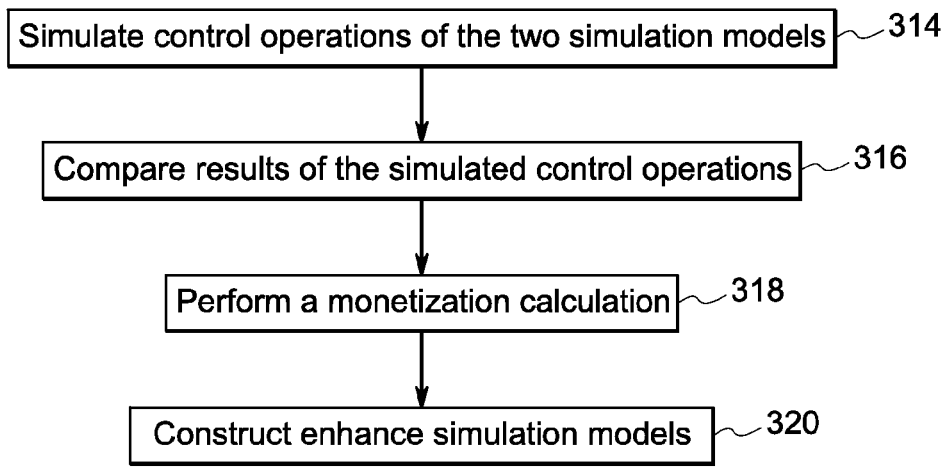

FIGS. 3A-3B illustrate a process flow diagram of a method for using cloud computing 102 to simulate operations of a control system of a plurality of clients 104, 106 and 108 to enable a customer to test a new product prior to implementation, to test a new product improvement within an existing customer system, and to compare implementation of a new product within different systems in order to enable the customer to select a new product. In an embodiment, the method utilizes a new novel technique running on the computing cloud 102.

At the first step, the cloud computing 102 receives from the user a request to select a new available product or service offered for sale as shown in block 302. The technique generates in block 304 a basic simulation model of the infrastructure that supports the operation of the user's current device based on information collected from the user, a network such as the Internet, and other sources. The technique then generates a model of the user's current device in block 306. The technique combines the basic simulation model of the infrastructure with the current device in block 308. Then, the technique generates a simulation model of the new product selected by the user in block 310.

The technique then generates a basic simulation model of the infrastructure operating with the new product by combining the simulation model of the new product in block 312. The technique runs the operation of the simulation of both basic models to obtain operational data in block 314. The technique performs a comparison of the operational data and results of the basic simulation model of the infrastructure operating with the current device with the basic simulation model of the infrastructure operating with the new product to determine the relative benefits in block 316. Then, the system monetizes the savings in block 318. The technique collects additional data regarding the basic simulation models to construct enhanced simulation models in block 320.

Figure 4:
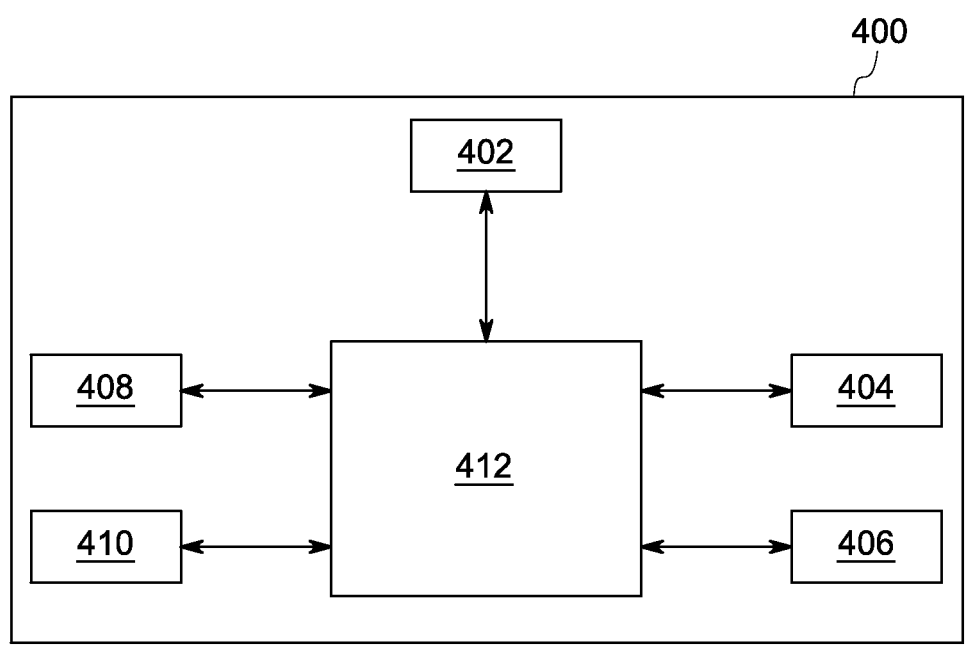
FIG. 4 illustrates an exemplary computing system.

Elements of the computing cloud 102 described above may be implemented on any general-purpose computer 400 with sufficient processing power, memory resources, and network throughput capability to handle the necessary workload demand. FIG. 4 illustrates a typical, computer system suitable for implementing one or more embodiments disclosed herein.

The general-purpose computer 400 includes a processor 412 (which may be referred to as a central processor unit or CPU) that is in communication with memory devices including secondary storage 402, read only memory (ROM) 404, random access memory (RAM) 406, input/output (I/O) 408 devices, and network connectivity devices 410. The processor may be implemented as one or more CPU chips.

It is noted that components (simulated or real) associated with the system 100 can include various computer or network components such as servers, clients, controllers, industrial controllers, programmable logic controllers (PLCs), communications modules, mobile computers, wireless components, control components and so forth that are capable of interacting across a network.

Similarly, the term controller or PLC as used herein can include functionality that can be shared across multiple components, systems, or networks. For example, one or more controllers can communicate and cooperate with various network devices across the network. This can include substantially any type of control, communications module, computer, I/O device, sensors, Human Machine Interface (HMI) that communicate via the network that includes control, automation, or public networks. The controller can also communicate to and control various other devices such as Input/Output modules including Analog, Digital, Programmed/Intelligent I/O modules, other programmable controllers, communications modules, sensors, output devices, and the like.

The network can include public networks such as the Internet, Intranets, and automation networks such as Control and Information Protocol (CIP) networks including DeviceNet and ControlNet. Other networks include Ethernet, DH/DH+, Remote I/O, Fieldbus, Modbus, Profibus, wireless networks, serial protocols, and so forth.

The secondary storage 402 is typically comprised of one or more disk drives or tape drives and is used for non-volatile storage of data and as an over-flow data storage device if RAM 406 is not large enough to hold all working data. Secondary storage 402 may be used to store programs that are loaded into RAM 406 when such programs are selected for execution.

The ROM 404 is used to store instructions and perhaps data that are read during program execution. ROM 404 is a non-volatile memory device that typically has a small memory capacity relative to the larger memory capacity of secondary storage. The RAM 406 is used to store volatile data and perhaps to store instructions. Access to both ROM 404 and RAM 406 is typically faster than to secondary storage 402.

I/O 408 devices may include printers, video monitors, liquid crystal displays (LCDs), touch screen displays, keyboards, keypads, switches, dials, mice, track balls, voice recognizers, card readers, paper tape readers, or other well-known input devices. The network connectivity devices 410 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA) and/or global system for mobile communications (GSM) radio transceiver cards, and other well-known network devices.

These network connectivity devices 410 may enable the processor 412 to communicate with an Internet or one or more intranets. With such a network connection, it is contemplated that the processor 412 might receive information from the network, or might output information to the network in the course of performing the above-described method steps. Such information, which is often represented as a sequence of instructions to be executed using processor 412, may be received from and outputted to the network.

The processor 412 executes instructions, codes, computer programs, scripts that it accesses from hard disk, floppy disk, optical disk (these various disk based systems may all be considered secondary storage 402), ROM 404, RAM 406, or the network connectivity devices 410.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

Alternative embodiments, examples, and modifications which would still be encompassed by the disclosure may be made by those skilled in the art, particularly in light of the foregoing teachings. Further, it should be understood that the terminology used to describe the disclosure is intended to be in the nature of words of description rather than of limitation.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

I claim:

1. A method for using cloud computing to simulate operations of a control system, the method comprising:
　　receiving at a cloud computing system a request to select a product;
　　defining a model of an infrastructure system associated with the selected product;
　　generating a first model of the infrastructure system including a first control system;

generating a second model of the infrastructure system including a second control system;

simulating a first control operations of the first model of the infrastructure system in operation with the first control system;

simulating a second control operations of the second model of the infrastructure system in operation with the second control system; and comparing results of the first control operations with results of the second control operations.

2. The method of claim 1, further comprises performing a monetization calculation to determine at least one monetary value based on the results of the first control operations and the second control operations.

3. The method of claim 1, wherein the first control system is configured to control at least one of a device, a service and a process and wherein the second control system is configured to control the selected product.

4. The method of claim 1, wherein the model of the infrastructure system includes each interconnected structural element that supports the operation of the infrastructure system and control elements and software that operate, manage, and monitor the infrastructure system.

5. The method of claim 1, wherein the step of defining the model of the infrastructure system further comprises receiving data to formulate a profile of the infrastructure.

6. The method of claim 5, further comprising: retrieving the data from at least one of a user input, a questionnaire, a survey, a standardized simulation of conventional infrastructures, industry templates, historical data, a database and Internet data.

7. The method of claim 1, wherein the infrastructure is selected from at least one of a manufacturing infrastructure, a residential infrastructure, an energy infrastructure, a transportation infrastructure, a communication infrastructure, a social infrastructure, and an economic infrastructure.

8. The method of claim 1, further comprises generating an enhanced simulation model of at least one of the model of the infrastructure, the first model of the infrastructure system in operation with the first control system, and the second model of the infrastructure in operation with the second control system.

9. The method of claim 8, wherein the step of generating the enhanced simulation model further comprises aggregating data regarding each interconnected structural elements that supports the operation of the infrastructure system and control elements and software that operate, manage, and monitor the infrastructure system.

10. The method of claim 8, wherein the step of generating the enhanced simulation model further comprises performing an iterative analysis to determine variations within the operation of the infrastructure system during a predetermined time based upon the simulation of at least one of the first control operation and the second control operation.

11. The method of claim 8, wherein the step of generating the enhanced simulation model further comprises performing a predictive analysis to determine operational problems and to compile an alarm priority list associated with the infrastructure system based upon the simulation of at least one of the first control operation and the second control operation.

12. The method of claim 8, wherein the step of generating the enhanced simulation model further comprises monitoring regulatory requirements associated with operating parameters of the infrastructure to obtain regulatory data and simulating at least one of the first control operations and the second control operations based on the regulatory data.

13. The method of claim 8, wherein the step of generating the enhanced simulation model further comprises monitoring at least one financial market based upon at least one of a product produced by the infrastructure and a service provided by the infrastructure to detect financial market fluctuations and simulating at least one of the first control operations and the second control operations based on the financial market fluctuations.

14. A cloud computing system comprising:
a computing cloud comprising at least one processing unit and at least one database;
a plurality of users in communication with the computing cloud;
wherein the computing cloud is configured to:
receive a request to select a product;
define a model of an infrastructure system associated with the selected product;
generate a first model of the infrastructure system including a first control system;
generate a second model of the infrastructure system including a second control system;
simulate a first control operations of the first model of the infrastructure system in operation with the first control system;
simulate a second control operations of the second model of the infrastructure system in operation with the second control system; and
compare results of the first control operations with results of the second control operations.

15. The system of claim 14, wherein the at least one processing unit is configured to perform a monetization calculation based on the results of the first control operations and the second control operations to determine a monetary savings value.

16. The system of clam 14, wherein the first control system is configured to control at least one of a device, a service and a process and wherein the second control system is configured to control the selected product.

17. The system of claim 14, wherein the model of the infrastructure system includes each interconnected structural element that supports the operation of the infrastructure system and control elements and software that operate, manage, and monitor the infrastructure system.

18. The system of claim 14, wherein the at least one processing unit is configured to formulate a profile of the infrastructure based on data received from at least one of a user input, a questionnaire, a survey, a standardized simulation of conventional infrastructures, industry templates, historical data, a database, and Internet data.

19. The system of claim 14, wherein the infrastructure is selected from at least one of a manufacturing infrastructure, a residential infrastructure, an energy infrastructure, a transportation infrastructure, a communication infrastructure, a social infrastructure, and an economic infrastructure.

20. The system of claim 14, wherein the at least one processing unit is configured to generate an enhanced simulation model of at least one of the model of the infrastructure, the first model of the infrastructure system in operation with the first control system, and the second model of the infrastructure in operation with the second control system.

* * * * *